(12) United States Patent
Rotondaro et al.

(10) Patent No.: US 6,214,736 B1
(45) Date of Patent: Apr. 10, 2001

(54) SILICON PROCESSING METHOD

(75) Inventors: Antonio L. P. Rotondaro; Reima Tapani Laaksonen, both of Dallas; Robert Kraft, Plano; Charlotte M. Appel, Dallas; Rebecca J. Gale, Allen; Katherine E. Violette, Dallas, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/419,606

(22) Filed: Oct. 15, 1999

Related U.S. Application Data

(60) Provisional application No. 60/104,411, filed on Oct. 15, 1998.

(51) Int. Cl.[7] .................................................. H01L 21/00
(52) U.S. Cl. .......................... 438/705; 438/695; 438/719; 438/753
(58) Field of Search ..................................... 438/694, 695, 438/705, 712, 719, 723, 753; 216/37, 67, 79

(56) References Cited

U.S. PATENT DOCUMENTS 3,536,547 * 10/1970 Schmidt ........................... 438/705 X \* cited by examiner

*Primary Examiner*—William Powell
(74) *Attorney, Agent, or Firm*—Carlton H. Hoel; W. James Brady; Frederick J. Telecky, Jr.

(57) ABSTRACT

A plasma process is described which produces an undamaged and uncontaminated silicon surface by consuming silicon by continuous oxidation through a surface oxide layer and a simultaneous etch of the exposed silicon oxide surface. The surface silicon dioxide layer thickness is controlled as an equilibrium between oxide growth from oxygen atoms reaching the silicon surface and etching of the oxide surface. The silicon dioxide protects the silicon surface from plasma damage and from contamination.

3 Claims, 4 Drawing Sheets

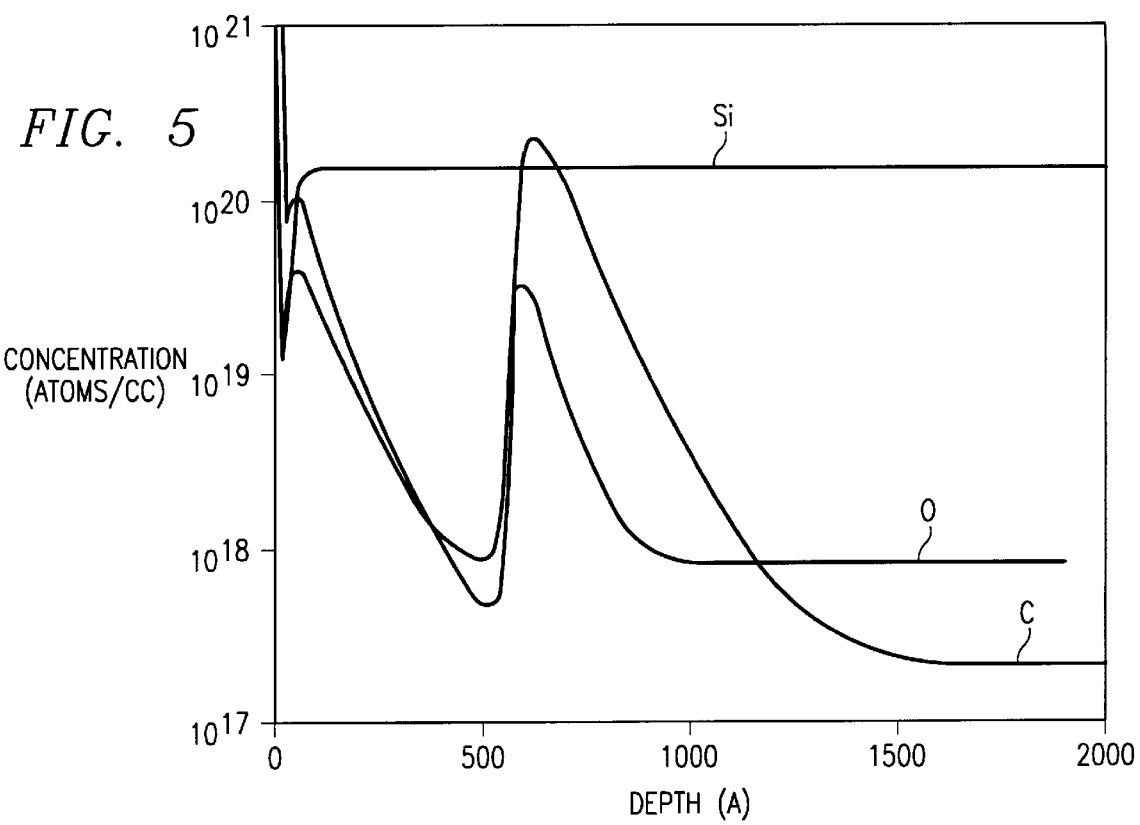
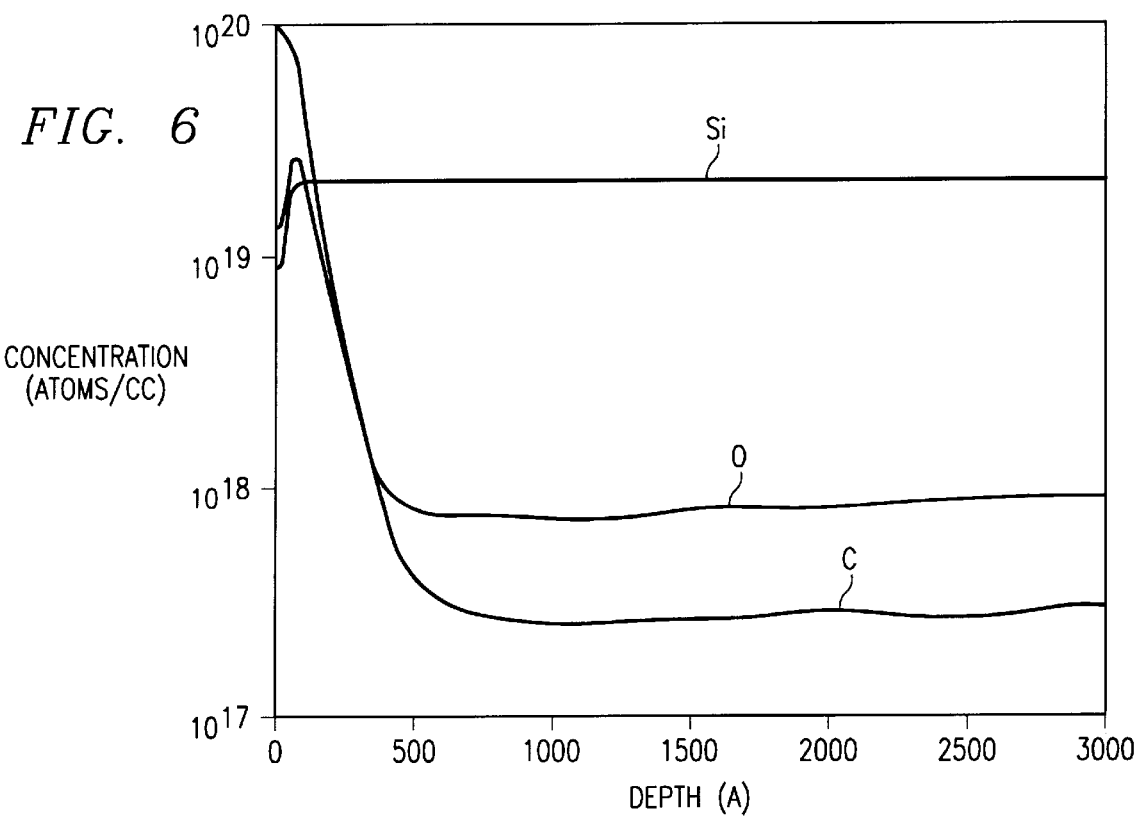

SILICON PROCESSING METHOD

CROSS-REFERENCE TO RELATED PATENT APPLICATIONS

This application claims priority from U.S. provisional patent application Serial No. 60/104,411, filed Oct. 15, 1998. The following co-pending application assigned to the assignee of this application discloses related subject matter: U.S. patent application Ser. No. 09/405,278, filed Sep. 23, 1999 (TI 25315).

BACKGROUND OF THE INVENTION

The invention relates to the field of semiconductor manufacturing technology and more specifically to the fabrication of contamination-free and damage-free silicon surfaces by the application of plasma processes.

The electronic industry follows a continuing trend of increasing speed and packing density of silicon ICs by shrinking all component dimensions. For MOS devices, the thickness of the gate dielectric is being decreased to the 2 nm range while the gate length of experimental MOS transistors is below 100 nm. Such small dimensions make it mandatory that all surfaces and interfaces are flat on an atomic scale and defect and contamination free. Examples for such thin layers include gate dielectric layers, conductive and isolating barrier layers, crystalline epitaxial layers, polysilicon layers, and contact and metallization layers.

Driven by requirements for better process control, wet etch and cleaning processes are being replaced by plasma processes utilizing automated process equipment. Additional advantages of the plasma technique include reductions for the requirements for cleanroom floor space and reduced handling and disposal of hazardous liquids.

Great attention is being paid to the production of defect-free gate dielectric layers and active layers for MOS-type devices fabricated by either ion implantation or by epitaxial deposition. Maintaining the layer quality throughout the complete process sequence is a great concern. Sources causing layer degradation include the exposure to energetic particles, charged or neutral, during processes like plasma etching, plasma enhanced chemical vapor depositions and sputter depositions. Defects can also be introduced by stresses due to differences in thermal expansion coefficients. Contamination can be caused by exposure to process fluids and gases. For plasma processes the redeposition of plasma etch byproducts has to also be controlled.

To describe the prior art of silicon dry etching, reference is made to U.S. Pat. No. 5,314,573 which presents HBr/Cl2 chemistry. Polymer deposition on the sidewall of etch masks is included in the process design to support the control of the gate stripe geometry. An improved plasma system for silicon etch was presented in U.S. Pat. No. 5,660,671. The process uniformity was improved by including rotating magnets. The deposition of polymers was controlled by adding SF6 to the process gas. In both cases the plasma was in close proximity to the wafer surface.

The concept of remote plasma was introduced to reduce the level of plasma radiation impinging on the wafer surface. Robust plasma etch systems employ inductive coupling at a frequency of about 13 MHz. Plasma systems operating at 2.45 GHz were developed to increase the concentrations of desired activated atoms.

As an example of such a process reference is made to a publication by Nishino et al.(J.Appl.Phys., 74 (2) Jul. 15, 1993). Using an oxygen/CF4 flow ratio of approximately 1, the authors showed how the SiFxOy polymer surface film can be used for smoothing of a rough silicon surface: the polymer film is thinner at exposed sharp edges, leading to higher etch rates in these areas and to a smoother silicon surface after the plasma etch. Brooks et al. (J.Vac.Sci. A16(1) January/February 1998) more recently reported progress in etching off damaged silicon surface layers in a remote plasma reactor, operating at 2.45 GHz using CF4/oxygen chemistry. Their approach to silicon plasma etch is conventional, i.e., the exposure of the bare silicon surface to ions and energetic particles is controlled by containing the plasma in a remote location and by controlling the electric field in the vicinity of the wafer.

Prior art etching of silicon without introduction of any process damage, e.g., as necessary for the surface preparation before monocrystalline epitaxial silicon deposition, relied on wet chemistry, such as H2O—H2O2—NH4OH chemistry. This process removes silicon in two steps, the silicon oxidation by H2O2 and the oxide etch by OH— radicals.

SUMMARY OF THE INVENTION

The present invention introduces a process which deviates from the prior art plasma etch approaches in that it adapts the advantageous principles of wet silicon etch to plasma etching. The preferred embodiments provide a plasma process which yields an undamaged and uncontaminated silicon surface by consuming silicon by oxidation through a surface dioxide layer and by simultaneously etching the exposed silicon dioxide surface. The silicon dioxide layer protects the silicon surface from plasma damage and from contamination.

The process is applied to defect free selective epitaxy, to low sheet resistance high quality cobalt silicide formation and to the controlled removal of very thin silicon layers.

BRIEF DESCRIPTION OF THE DRAWINGS

FIG. 5 and FIG. 6 are SIMS data.

DESCRIPTION OF THE PREFERRED EMBODIMENTS

Figure 1A:
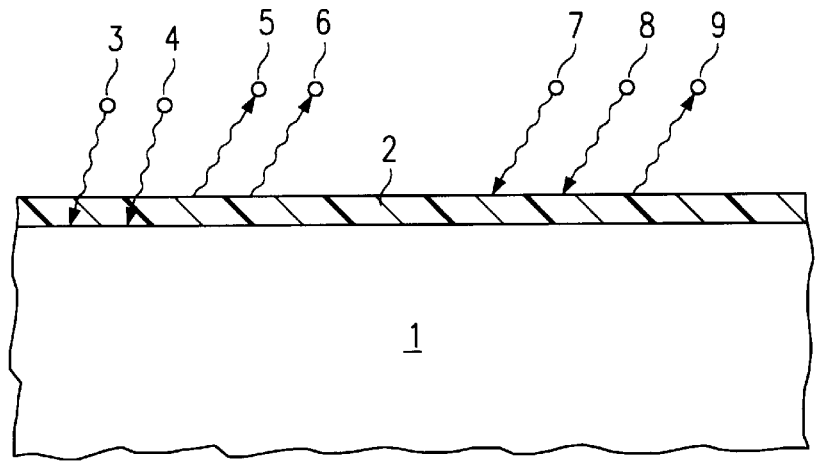
FIGS. 1A–1B show prior art silicon processes.
Figure 1B:
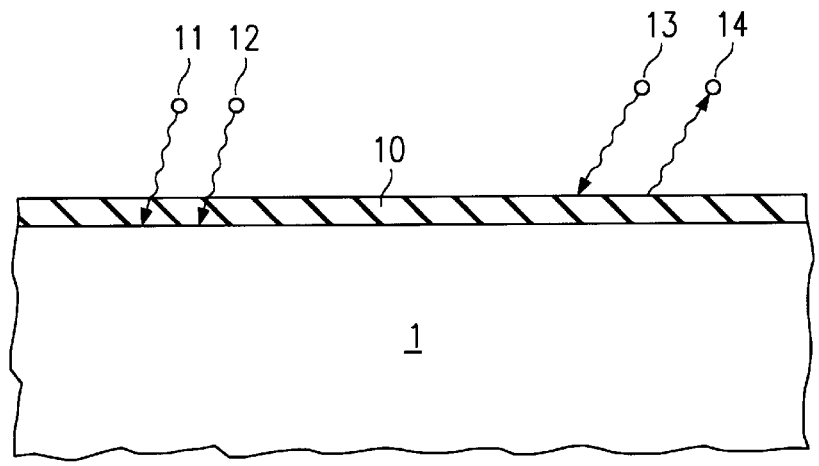

To clearly contrast the contribution of present invention from prior art, FIGS. 1-A and 1-B schematically depict prior art plasma etching and wet etching. FIG. 1A shows plasma etching with HBr/Cl2 chemistry and with CF4/O2 chemistry. A silicon wafer 1 is exposed to chlorine 3, bromine 4, ionized or neutral, depending on the reactor. The reaction products, silicon tetrachloride 5 and silicon tetrabromide 6, are carried away by the process gas flow. For the case of CF4/O2 chemistry, fluorine 7 and oxygen 8 impinge on the surface and the reaction product is gaseous SiF4, 9. In both cases a thin polymer layer 2 forms on the surface, affecting the etchrate and potentially contaminating the surface. No effort is made to avoid exposure of the silicon surface to the polymer or to the reactants. For detailed review of the CF4/O2 plasma chemistry reference is made to the publication by M. Dalvie and K. F. Jensen, J. Electrochem. Soc. Vol 137, No. 4,1990.

FIG. 1-B depicts schematically the principle of a wet silicon etch in a H2O2+NH4OH+H2O solution, a widely used etch in the electronics industry for the production of a defect-free silicon surface. H2O2 11 and HO2- 12 do not react with the native silicon dioxide layer 10 which covers the silicon wafer 1. They diffuse through the oxide 10 and react with the silicon forming additional oxide, thereby consuming silicon. Simultaneously, the oxide surface is etched by hydroxyl groups 13 and the reaction product HSiO3- 14 goes into solution. After the process reaches equilibrium, the rate for the oxide formation at the silicon/oxide interface and the oxide etch rate are equal. The silicon surface is never in direct contact with the liquid. Because the silicon consumption results from the silicon oxidation by the reactants that diffuse through the existing chemical oxide, the process is isotropic and does not delineate crystal defects.

Figure 2:
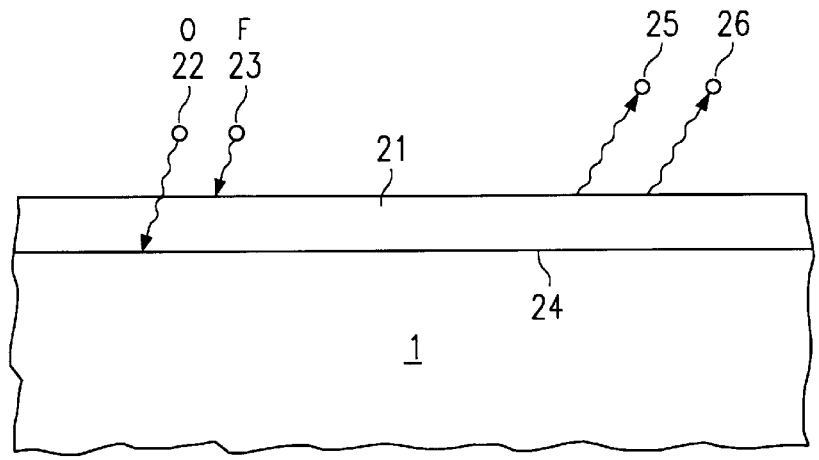
FIG. 2 shows a preferred embodiment silicon plasma etch.

FIG. 2 schematically presents the plasma etch process according to this invention. C2F6/O2 chemistry is used in a remote plasma reactor. Oxygen 22 impinges on the oxide surface and diffuses through the surface oxide film 21 to the silicon interface 24 forming additional oxide there. Simultaneously, fluorine 23 attacks the oxide surface and the reaction products SiF4 25 and oxygen 26 are swept away. The gas composition for this process is chosen so that the steady state oxide thickness, resulting from the formation of new oxide at the silicon interface and from the oxide removal from the top surface is approximately 2 nm. The process chemistry has the potential for the formation of a surface polymer layer. The preferred embodiment gas ratio was chosen to avoid polymer formation. As expected from the similarity between this plasma etch and the wet etch described above, this plasma etch is isotropic; i.e., it does not etch specific crystal orientations preferentially.

The plasma system used for experiments with the preferred embodiment methods was a robust mass-production-oriented Mattson Aspen system; however, any system that offers similar plasma conditions can be used. It has a remote inductively coupled plasma source operating at 13 MHz. The chosen gas flows were 3000 sccm of oxygen and 6 sccm of C2F6 and the pressure was 1.3 Torr. The wafer temperature was 250 C when the wafer was in contact with the heated holder or close to ambient temperature when the wafer rested on pins above the holder.

Figure 3:
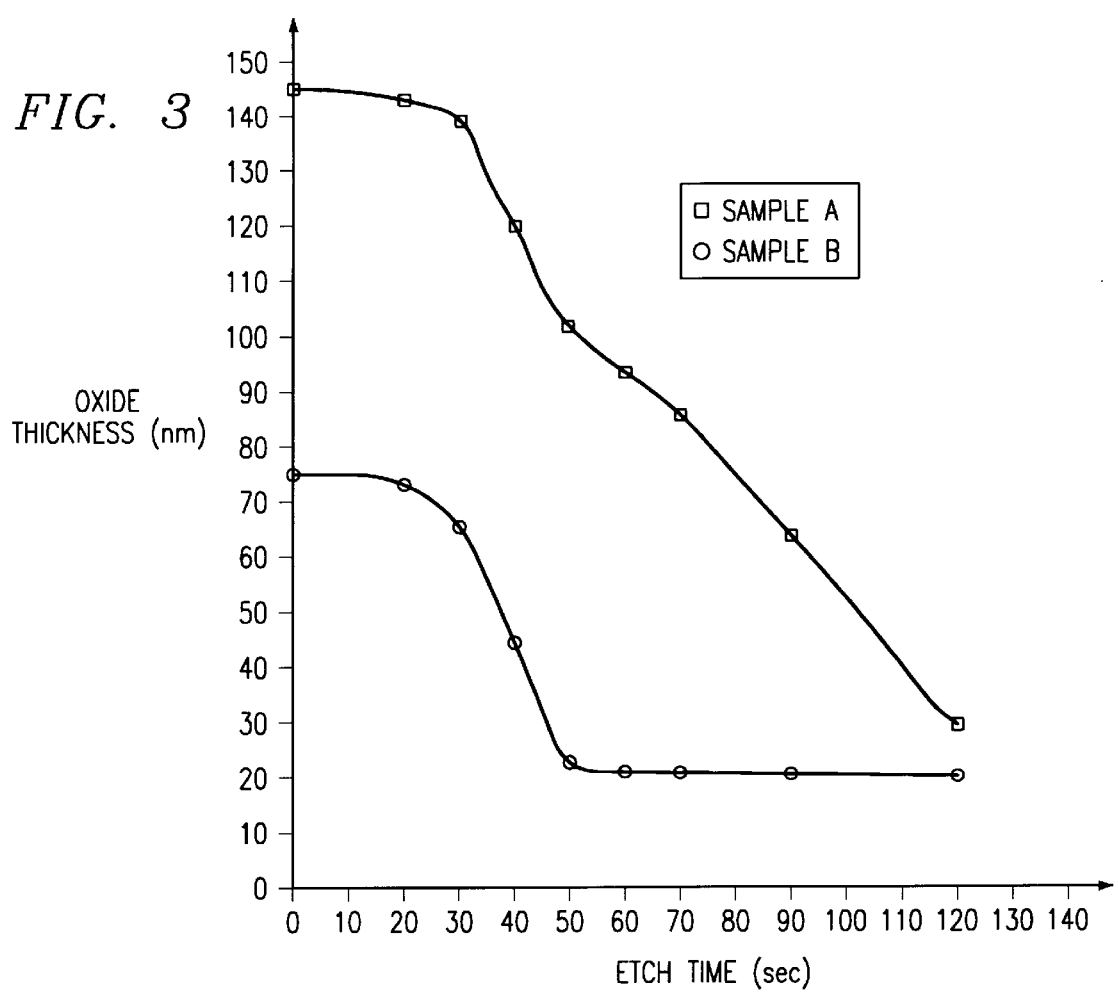
FIG. 3 illustrates oxide thickness as a function of plasma exposure time.

FIG. 3 presents the results of one experiment to demonstrate the principle of the preferred embodiments that the etch process establishes an equilibrium between the oxide removal and new oxide growth at the oxide/silicon interface. Due to the required diffusion of oxygen through the oxide, an increasing oxide thickness is expected to lead to lower or even zero oxide growth rate. The test wafers had starting oxide thicknesses of 14.32 nm (Sample A) and 7.48 nm (Sample B). FIG. 3 presents the oxide thickness as a function of etch time. After an initiation time of approximately 20 seconds, the oxide thickness declines and reaches the equilibrium value of 2 nm after 50 sec for sample B and after 120 sec for sample A, consistent with the plasma etch model of this process.

Figure 4:
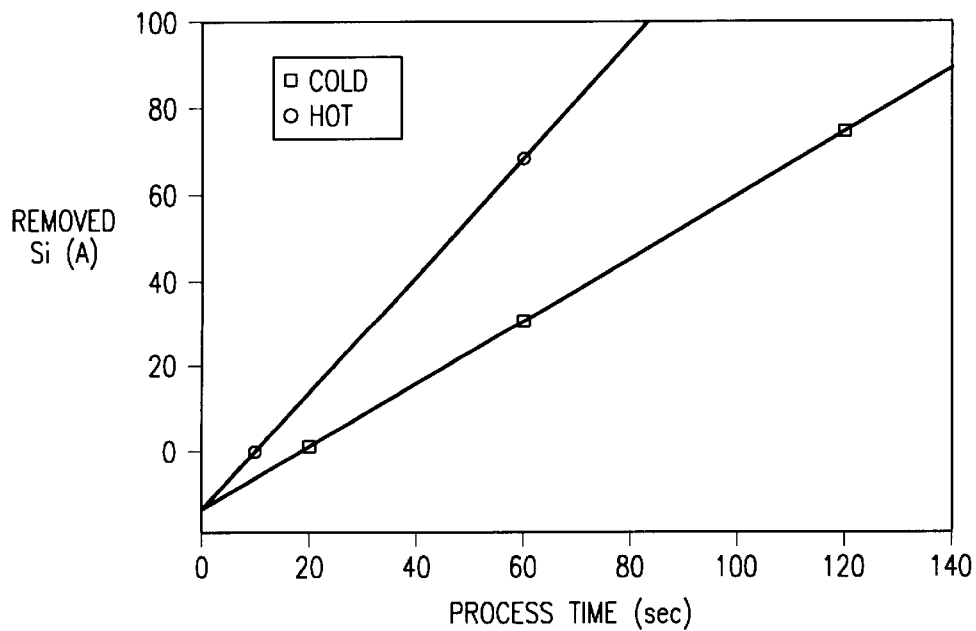
FIG. 4 shows the thickness of the removed silicon as a function of plasma exposure times.

FIG. 4 presents the thickness of removed silicon versus etch time. The etch rate is 0.14 nm/sec for a wafer temperature of 250 C and 0.07 nm/sec when the wafer is at ambient temperature.

FIGS. 5 and 6 compare SIMS data from epitaxial structures to demonstrate the effectiveness of the new plasma etch process to produce an uncontaminated epitaxial interface. 50 nm thick silicon layers, as designed for MOS transistors with raised source and drain regions, were deposited in a commercial single-wafer radiantly-heated epitaxial reactor, applying the known SiH2Cl2/HCl/H2 chemistry. One wafer, sample C, received a 60 sec plasma etch according to the present preferred embodiment. The control wafer, sample D, was processed without the plasma etch. According to standard practice both samples received a wet HF clean before loading into the epitaxial system followed by an in-situ pre-epitaxy H2 bake. FIG. 5 shows data from sample D: a carbon and an oxygen peak is present at the location of the interface between the epitaxial layer and the silicon substrate. The SIMS data in FIG. 6 from sample C show that the application of the preferred embodiment plasma process resulted in interfaces with no carbon and oxygen contamination.

Figure 7A:
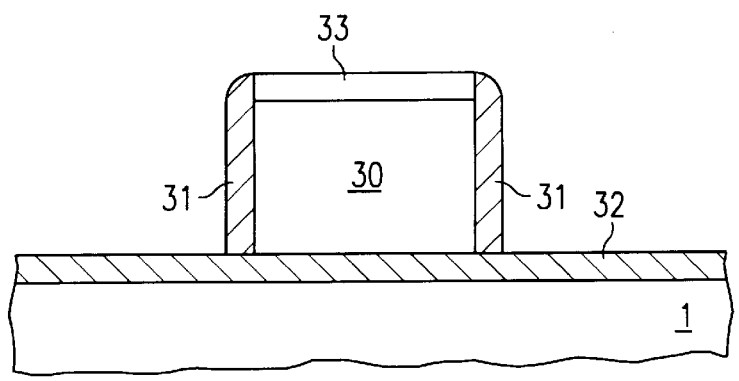
FIG. 7 depicts schematically cross-sectional views of a MOS structure with epitaxially thickened source and drain regions.
Figure 7B:
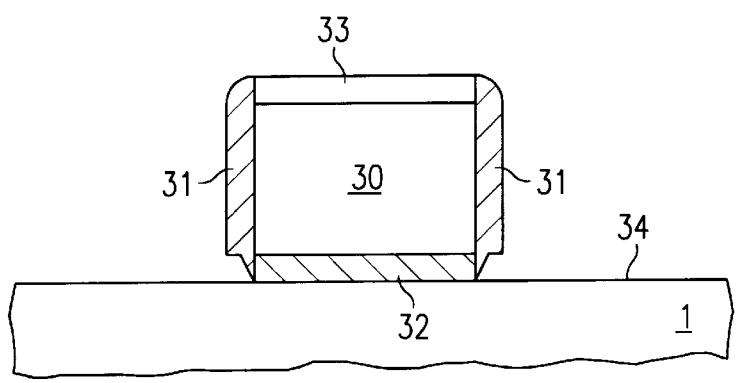
Figure 7C:
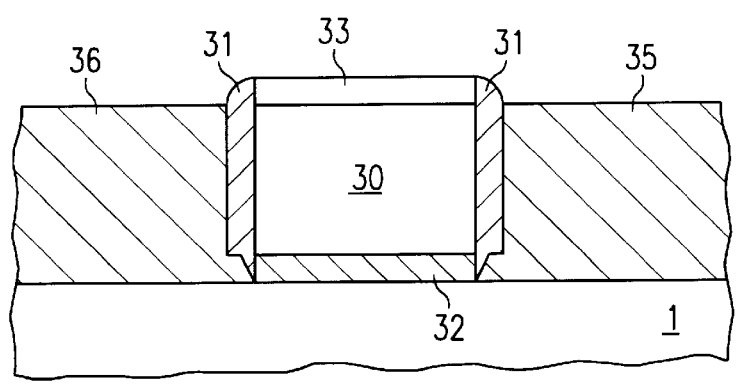

FIGS. 7-A through 7-C describe schematically one example of the preferred embodiment applied to the manufacture of an advanced MOS structure with epitaxially raised source and drain regions. Standard process steps such as oxidations, photolithography, material deposition and etching by chemical vapor processes, ion implantation, et cetera are applied and not detailed for this description. FIG. 7-A depicts the structure at a point in the process flow where a conductive polysilicon gate stripe 30 has been formed on a gate dielectric film 32. A dielectric spacer layer 31 covers the gate sidewalls and a growth mask layer 33 defines the area for the selective epitaxial deposition. In preparation for the epitaxy this structure is next treated by the preferred embodiment plasma clean, leading to a contamination-free silicon surface 34 indicated in FIG. 7-B. FIG. 7-C shows the structure after selective epitaxial growth of the highly conductive source and drain regions, 35 and 36. The fabrication of the MOS structure continues with known process steps.

The absence of contamination at the epitaxial interface eliminates a group of problem areas previously associated with silicon selective epitaxy for thin and small MOS structures Carbon and oxygen contamination of the starting surface can cause defect nucleation in the epitaxial film, leading to lateral overgrowth, where Si grows from the exposed Si surface and surrounds the contamination. This causes control problems for later salicide treatments. For selectively grown raised source/drain structures, defects may propagate into the substrate and cause leakage current problems. Lateral overgrowth is associated with thickness variations and can cause salicide junction spiking. Carbon contamination at the starting growth surface also delays the onset of epitaxial growth. An inconsistent incubation time causes variability of the epilayer thickness.

Figure 8:
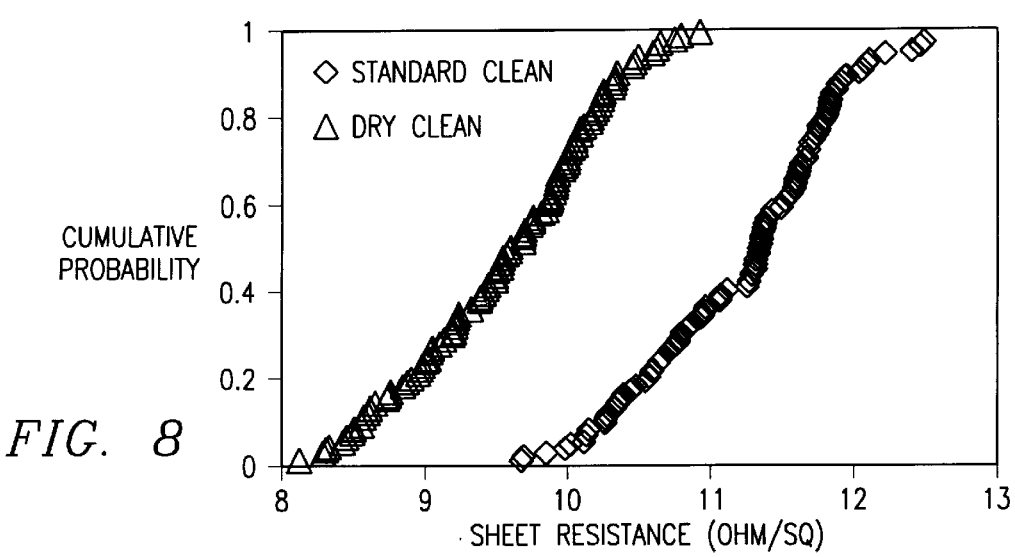
FIG. 8 shows sheet resistance data of cobalt silicide/polysilicon films.

Surface silicon contamination has detrimental effects on the formation of cobalt silicide films developed, for example, to reduce the sheet resistance of polysilicon gates. Such films can be produced by physical vapor deposition of cobalt on the silicon surface followed by a rapid thermal process reaction. FIG. 8 presents data comparing the sheet resistance of 0.34 micrometer wide cobalt silicide stripes produced by a process which applied the preferred embodiment plasma cleaning, shown as "Dry Clean", and by a "Standard Clean" which combined an oxygen plasma with a wet process sequence using H2SO4+H2O2+H2O followed by NH4OH+H2O2+H2O. The statistical presentation of the multitude of data from test structures demonstrated that for the preferred embodiment process the center of the sheet resistance distribution was reduced from 11.5 to 9.5 ohm/sq.

In general, carbon contamination resulting from reactive ion etch steps could previously only be removed by sacrificial silicon oxidation and by wet oxide strip steps, which is undesirable because of the associated excessive thermal budget. The preferred embodiment methods can now accomplish the same without excessive thermal budget.

The preferred embodiment methods of a silicon plasma etch with oxygen plus fluorine in which only an oxide (and not polymers) forms in equilibrium on the silicon surface can be varied such as differing sources for the oxygen and fluorine (including various fluorocarbons), differing etch conditions such as pressure and flow rates, and reactor type such as remote versus adjacent plasmas, inductive coupling or helicon wave, and so forth. Indeed, if the fluorine were increased/decreased (but not so much that polymers form), then the silicon dioxide would volatilize faster/slower; but this implies a thinner/thicker silicon dioxide layer and faster/slower diffusion of oxygen through to oxidize the underlying silicon. Thus an equilibrium obtains.

An oxygen to fluorine ratio of more than about 100 to 1 provides the oxidation plus oxide removal to controllability decontaminate and etch silicon.

What is claimed is:

1. Silicon surface processing method, comprising the steps of:

(a) provide a silicon substrate; and (b) provide first and second species over said substrate, said first species oxidizes silicon and diffuses through silicon dioxide plus said second species volatilizes silicon dioxide;

(c) wherein said first and second species remove silicon from said substrate with an equilibrium silicon dioxide layer on said silicon substrate.

2. The method of claim 1, wherein:

(a) said first and second species are formed from a plasma.

3. The method of claim 1, wherein:

(a) said first species derives from oxygen and said second species derives from C2F6 or CF4.

* * * * *